United States Patent
Schneider et al.

(10) Patent No.: US 6,395,163 B1
(45) Date of Patent: May 28, 2002

(54) PROCESS FOR THE ELECTROLYTIC PROCESSING ESPECIALLY OF FLAT ITEMS AND ARRANGEMENT FOR IMPLEMENTING THE PROCESS

(75) Inventors: Reinhard Schneider, Cadolzburg; Rolf Schroeder, Burgthann; Klaus Wolfer, Böblingen; Thomas Kosikowski, Burgthann, all of (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/170,601

(22) Filed: Oct. 13, 1998

Related U.S. Application Data

(63) Continuation-in-part of application No. 08/374,679, filed on Jan. 25, 1995, now abandoned.

(30) Foreign Application Priority Data

Aug. 1, 1992 (DE) .......................... 42 25 541
Jul. 20, 1993 (DE) .......................... 43 24 330

(51) Int. Cl.[7] ............. C25D 5/22; C25D 19/00
(52) U.S. Cl. ............ 205/93; 204/198; 204/202; 204/203; 204/224 R; 204/227; 204/275; 205/125; 205/137; 205/148; 205/150; 205/222; 205/920
(58) Field of Search ................ 205/93, 125, 126, 205/137, 148, 222, 920, 150, 152; 204/198, 202, 203, 224 R, 227, 275

(56) References Cited

U.S. PATENT DOCUMENTS

| | | | |
|---|---|---|---|
| 4,036,705 A | * | 7/1977 | Eidschun, Jr. ............. 205/117 |
| 4,481,081 A | * | 11/1984 | Doubt ...................... 205/105 |
| 4,610,772 A | * | 9/1986 | Palnik ...................... 204/206 |
| 4,661,213 A | * | 4/1987 | Dorsett et al. .............. 205/50 |
| 4,692,222 A | * | 9/1987 | Pellegrino et al. .......... 205/125 |
| 4,933,049 A | * | 6/1990 | Murphy et al. ............. 205/88 |
| 5,211,826 A | * | 5/1993 | Hosten et al. .............. 204/198 |

FOREIGN PATENT DOCUMENTS

| | | |
|---|---|---|
| DE | 1446045 | 11/1968 |
| DE | 3525183 | 2/1986 |
| DE | 3603856 | 8/1987 |
| EP | 0142010 | 5/1985 |
| EP | 0210072 | 1/1987 |

OTHER PUBLICATIONS

Product Finishing, "Electroplating at Mils/Min.", Aug. 1971, pp 50–60.*
Elektrolytische Hochlerstungsverinkung von Stahlband durch mechanische Grezschichtbeeinflussung, B. Meuthen & D. Wolfhard, Metalloberfläche 36 (1982) (2) pp. 70–75.
"Das Tampongalvanisieren, Anwendung für dekorative Überzüge", Dr. M. Rubinstein, Galvanotechnik 79 (1988) Month of Publication Not Available Nr 9 pg. 2876–2882.
"Das Tampongalvanisieren, 1. Teil: Geschichtliches, Voreile und Nachteile", Dr. M. rubinstein, Galvanotechnik 73 (1982) Month of Publication Not Available Nr 2, pp. 120–124.

* cited by examiner

*Primary Examiner*—Bruce F. Bell
*Assistant Examiner*—William T. Leader
(74) *Attorney, Agent, or Firm*—Cohen, Pontani, Lieberman & Pavane

(57) ABSTRACT

A process for electrolytically processing a flat perforated item, comprising the steps of: moving the item in a transport direction to a treatment station where the item is contacted with an electrolyte, continuously mechanically wiping, in the presence of one of a cathodic item and an anode, and an anodic item and a cathode, a surface of the item using means for reducing the thickness of a diffusion layer depleted in metal ions adjacent the surface of the item, which means include a wiping roller extending perpendicular to the transport direction over the entire width of the item and in contact with the item; and moving the electrolyte in a direction substantially perpendicular to a plane of the item so as to direct the electrolyte only toward the perforations in the item and to convey the electrolyte through the in the item under pressure.

45 Claims, 16 Drawing Sheets

PROCESS FOR THE ELECTROLYTIC
PROCESSING ESPECIALLY OF FLAT ITEMS
AND ARRANGEMENT FOR
IMPLEMENTING THE PROCESS

This is a Continuation-In-Part of application Ser. No. 08/374,679 filed Jan. 25, 1995, now abandoned.

BACKGROUND OF THE INVENTION

1. Field of the Invention

The invention relates, first, to a process for the electrolytic processing of printed circuit boards with drillings, which are taken through a treatment bath or to a processing station by conveyor means, in which there are means for reducing the thickness of a metal-ion-depleted region (diffusion zone), which are in contact with the printed circuit boards. The preferred area of use for the invention is galvanization, which will be discussed in more detail below. The invention can also be used in electrolytic etching.

2. Discussion of the Prior Art

The surface of the items to be processed or their diffusion layer becomes depleted of metal ions in a disadvantageous manner during processing, because the cathode draws more ions to it than usually come out of the surrounding treatment bath. This leads to a reduction in the acceptable specific current density, and thus means that in order to achieve such a metal coating having a particular thickness, a correspondingly long treatment time is needed.

In order to overcome this disadvantage, the so-called "high-speed" process can be used, in which the electrolyte is conducted at great speed and in great quantity along the cathodic surface between this surface and the anode (see European Patent 0 142 010 and German Patent 35 25 183, for example). It is true that using this process, an improved, i.e. increased, current density of the metal coating on the cathodic item is achieved. However, the production, control and discharge of such an electrolytic current is relatively expensive. The creation of the flow channels necessary for this requires added constructive expenditures. In addition, the manner of conveying the items to be processed can be complicated. For these reasons, it has become known only for continuous items to be processed, such as strips or wires.

In the article "Electrolytic High-Power Overgalvanization of Steel Strip through Boundary Layer Control" ("Electrolytische Hocheistungoverzinkung von Stahlband durch mechanische Grenzschichtbeeinflussung") by D. Meuthen and D. Wolfhard in the journal *Metal Surface* 36 (*Metaloberfläche* 36) (1982, pp. 70–75), a process for the electrolytic galvanization of steel strip is described, in which the strip surface to be galvanized is pressed against and moved relative to a nonwoven fabric, similarly to in the so-called tampon or brush galvanizing process. The coating electrolyte is rinsed through the nonwoven fabric onto the steel surface. Higher current density is achieved through this process during electrolytic zinc deposition.

A similar principle is also described in European Patent Application 0 210 072 for the electrolytic coating of small metal parts which are coated with noble metals, especially for use as plug-type connectors.

Furthermore, a process for the coating of surfaces is known from U.S. Pat. No. 3,706,650, in which non-conductive, fluid-storing, porous, compressible means are pressed against the surfaces to be coated and moved relative thereto, whereby the counter-electrode to the object to be coated is located in the interior of these means. The electrolytic fluid flows from the outside to the contact surfaces between the porous, compressible means and the surfaces to be coated. The porous, compressible means also contains hard non-conductive particles, which somewhat roughen the surfaces of the metal work piece to be coated.

In the three aforementioned documents, no reference is made to the flow through drill holes required in the manufacture of printed circuit boards, because in all cases the surfaces to be coated are either flat or merely curved.

In the German Document for Public Inspection 14 46 045, a process for galvanization with simultaneous electrolytic cleaning of metal surfaces and a device for implementing this process are disclosed. What is involved in this case is the coating of large drillings in steel with the help of an inner electrode, the outer areas of which are rubbed on the inner areas of the drillings. A device of this type is not suitable, however, for the electrolytic processing of printing circuit boards with drillings.

From DE-OS 36 03 856, a process and a device for galvanizing flat items such as printed circuit boards are known. The flat items are grasped and transported by a cathodically connected roller pair rotating at a relatively slow rotational speed. The electrolyte is applied to the item by an anodically connected roller pair, the surface of which can absorb fluid. A small distance is deliberately maintained between the surface of the item and the surface of the anodic rollers. The rotational speed of the anodic rollers is relatively high, in order to attain a correspondingly fast electrolytic movement along the surface of the item. In this way, an increase in current density is achieved, compared to conventional immersion bath galvanization. Thus rotating, insoluble roller pairs as anodes are described. The metal is supplied in soluble fashion via the electrolyte. The anodic roller pairs are not located below the level of the bath; therefore the electrolyte must continuously be applied to the galvanization location. The quantity of supplied electrolyte is limited, not least of all due to the close plastic screenings over the rollers. This also limits the possible galvanization current density. The plastic screenings are needed, however, in order to delay an undesired galvanization of the other, cathodically-connected roller pairs, which serve to transport the circuit boards.

Because the rotating anodic roller pairs do not touch the upper sides of the circuit boards, the diffusion layer located on the surface is not mechanically disturbed. However, the space between the anodic roller and the upper side of the circuit boards and thus the space between the pairs themselves is needed, to allow the galvanizing currents for the two sides of the circuit boards to be individually set. During galvanization of the conductor path image, this is always necessary, because the two sides of the circuit board, in practice, have uneven copper areas. For this reason, the anodes of the upper side of the circuit board are fed from one bath current rectifier and the anodes of the bottom side are fed from a different rectifier. Each rectifier can be individually set in respect to current.

Another disadvantage of the aforementioned invention is the very poor flow through fine holes in the printed circuit boards. On board sides located opposite to one another, electrolyte is applied in a small quantity in an almost pressure-free manner. This prevents the flow from going through the holes, resulting in inadequate galvanization of the hole walls even to the point of burns in the holes.

SUMMARY OF THE INVENTION

The invention is based on the problem of designing a generic process so as to achieve the desired reduction in thickness of the ion-depleted border layer on the anode surface or cathode surface (diffusion layer), and to thus attain a correspondingly increased current density of the galvanization current flowing from the electrolyte onto the anodic or cathodic item, while avoiding, however, the constructive and process-related expenses of the so-called "high-speed" flow technique.

This problem is solved and this object attained, first, starting from the generic prior art, in that in the presence of an anode and cathodic items to be processed, or in the presence of anodic items to be processed and a cathode, the surface to be treated of the items is wiped continuously by machine and the electrolyte is conveyed by a component vertical to the plane of the items and is passed through the drillings or drill holes (referred to hereinafter for the sake of simplicity as "drill holes") of the items.

This wiping of the area or areas in question serves, in a simple, advantageous and industrially implementable manner, to counteract the disadvantageous depletion of metal ions in the diffusion layer. The diffusion layer is largely destroyed, and thus the ion-depleted zone on the surface or surfaces in question is completely or at least largely eliminated. The metal ions of the electrolyte can therefore make their way directly onto the surface of the items in question, or, during etching, can be removed therefrom. In respect to further advantages, reference is made to the discussions below of the various possible designs of the invention, in respect to both process and object. By means of the combination according to the invention of the aforementioned wiping and the metallization of the surface which this achieves with the metallization of the inner walls of the drill holes based on conveying the electrolyte through the drill holes, an adequate treatment of the inner wall of the drill holes is simultaneously achieved, and thus the metallization of the treatment items is achieved on all required areas (surfaces and drill holes) with satisfactory results in one work step and using relatively simple measures. In this connection, the aforementioned combination has the advantage that the wiping sequence destroys any surface tension existing on the fluid in the drill holes, making it even easier to metallize the drill hole inner wall. As the examples of this invention show, the structural means for wiping, on the one hand, and for conducting the electrolyte through the drill holes (so-called "flooding"), on the other, can be provided together in a simple and space-saving manner, and in the preferred design of the invention are even combined. Here reference is made, for example, to the design according to FIG. 15. A further advantage is that with the aforementioned flooding—particularly when this is still done by supporting a pressing of the electrolyte, e.g., by means of a pump, into the drill holes and/or a drawing of the electrolyte out of the drill holes by means of a suction device—any particles that might still be present in the drill holes can be extracted from the drill holes and transported away. This avoids the danger of particles trapped in the drill holes becoming embedded through metallization and of the drill hole in question becoming clogged, which leads to rejection of that particular circuit board.

Furthermore, in this connection, the danger is avoided of abrasive or chip particles still adhering to the edge of the drill holes being grasped by the wiping coatings and transported along the surface of the items to be processed, which can damage and even render unusable the delicate surface of the items to be processed.

A complementary attainment of the object is represented by a process in which an appropriate relative movement between the cathodic or anodic items to be processed on the one hand and an anode-side or cathode-side wiping device on the other hand achieves the effect according to the invention.

In achieving this relative movement, the transport movement of the items to be processed may be used as an alternative when the items are taken by conveyor means through a treatment bath.

The possible process measures provided according to the invention for the attainment of the object may preferably be used for galvanization, but may also be used for electrolytic etching. The items (work pieces) to be processed thereby has an anodic function, i.e., it is anodically connected. The etched-away metal is precipitated on a counter-electrode (cathode). The counter-electrode can be the wiping device. Then, in a later work step, the precipitated metal is carried away and re-obtained. Electrolytic etching of this type is an alternative to purely chemical etching. During electrolytic etching, a simultaneous wiping of the anodes disrupts a border layer appearing there.

In order to simplify the presentation of the invention, the invention will be discussed below, and in the description of the examples related to the drawings, in reference to processes and devices for galvanization.

The movement of the coated anode relative to the item to be galvanized, whereby the coating bears against the item, largely destroys the diffusion layer (see above) and thus completely or largely eliminates the metal-ion-depleted region on the surface of the items to be processed.

The ions of the electrolyte can make their way directly through the coating of the anode to the surface of the item to be processed and metallize it. In this way, relatively high current densities can be achieved, and with good quality, particularly with an even strength of metal layer precipitated on the item surface, e.g., a copper layer. This is a significant advantage, which is especially important when it is not the entire area that is to be coated, but only the surface of conductor paths located on a circuit board of this type. A further significant advantage of the invention is that the distance between the anode and the cathodic item is still determined only by the thickness of the coating on the wiping device, whereby this thickness, however, can be relatively small. Due to the very small distance thus achieved between the anode and the cathode, different field line concentrations of the galvanization current flowing from the anode to the cathode practically do not exist, or at least exist to a considerably lesser extent than in arrangements in which a comparatively large distance exists between the anode and the cathode. In previously known arrangements with a relatively large distance between the anode and cathode, it was necessary, in order to avoid damaging effects such as increased metal precipitations on edge regions, e.g., the so-called "dog-bone" effect, to make appropriate expenditures, e.g., to provide "blendings." This is especially true in the case of flat items to be processed, such as electronic printed circuit boards, which have a great many drillings. Here, considerable scatterings (known as drill hole scatterings) can result on the edge region of the boards and in the drill holes.

A significant advantage of the invention is that it achieves higher current density values, without the depletion of metal ions causing so-called "burns" or the like of the metal to be deposited. Blendings or similar measures against excessive scatterings of the galvanizing current are not needed. A further significant advantage of the invention is that it is suitable for the automatic galvanization of items running continuously through a unit (perforated boards or the like).

This will preferably occur in the case of items arranged and transported horizontally (see, for example, DE-OS 36 24 481, discussed below). However, the invention can be used not only with horizontal, but also with vertical or slanted runs, and such usage will be accompanied by the advantages discussed above, particularly the avoidance of damaging scatterings at high current densities. When it is possible for higher current densities to be applied, as they can be as a result of this invention, the transport speed also becomes faster or the treatment route shorter. In particular, it is not necessary to ensure a disturbingly high flow rate of the electrolyte.

With the invention, a wiping effect is automatically achieved on the entire surface to be treated, in particular, on both sides or surfaces of flat items. For the sake of completeness, it should be mentioned that in manual galvanization, the process referred to as tampon galvanizing is known, used particularly for the processing, repair or improvement of larger components which cannot be processed or can be processed only with great difficulty in a galvanizing unit. Typical examples of this are the improvement or galvanization of metal church roofs, large monuments and the like. For details, reference is made to the publications of RUBINSTEIN in the journal Galvanotechnik ("Galvano-Technology") No. 73 (1982), pp. 120 ff; No. 79 (1988) pp. 2876 ff and pp. 3263 ff. Such a tampon process, however, can be used only for the aforementioned special cases, not for the industrial production of printed circuit boards with drillings and the like.

In a preferred design form of the invention, not only the transport speed of the processed items, but also the speed of the coated anodic device itself is used to achieve an intensive wiping effect. Depending on requirements and design, a great variety of effects and wiping speeds can be achieved.

The aforementioned relative speed may be low, e.g., almost approaching zero. Furthermore, in implementing the process according to the invention, pressure can be exercised by the wiping device on the items to be processed. In the presence of an elastic coating on the wiping device, the coating can be flattened or pressed. Apart from the fact that irregularities in the thickness of the items can be smoothed out in this way, this helps to reinforce the effect according to the invention of disrupting the diffusion layer. This is especially true for the disclosed combination of features.

Further process measures promote the passage of the electrolyte through the drill holes and thus the metallization of the inner walls of the drill holes. Furthermore, they contribute to extracting from the drill holes particles or the like present therein.

The invention is also based on the object of creating an arrangement for the electrolytic processing of printed circuit boards with drillings, which are taken by conveyor means through a treatment bath, or conducted to a treatment station, whereby means for reducing the thickness of a metal-ion-depleted zone (diffusion layer) are provided, which are in contact with the printed circuit boards, which arrangement achieves flawless electrolytic processing, possible with simple means, of one or both surfaces of the printed circuit boards as well as of the drillings or drill holes (hereinafter called "drill holes") located therein. This is possible in particular with the process measures according to one or more of the process claims of the present invention.

To attain these objects and solve these problems, first of all, the arrangement has means for wiping the surface or surfaces of either cathodic items or anodic items, and also has means for conducting the electrolyte, in a flow roughly vertical to the plane of the items to be processed, through the drill holes of the latter (flooding means). This principle of the invention is to be realized in a structurally simple form, as will be seen in greater detail in the discussion which follows, particularly the discussion of the examples.

Wiping devices with the coating are an especially advantageous design form of the invention for mechanical wiping.

It is recommended that the coating be allowed to bear against the surface of the items to be processed with a certain pressure force. This is especially advantageous in processing conductor paths and drill holes, because the fluid in the drill holes has on its surfaces a certain surface tension that is disturbed by this wiping, thus clearing the way for ions, in order to form a metal layer (during galvanization) on the surfaces. Such a pressure force can, for example, be achieved through spring bearings of the wiping device, especially the aforementioned rollers.

Flat items are especially suitable for being conveyed between rollers. Rollers per se are known in their structure and their use in units for processing flat objects; however, they are known not in this form of wiping rollers according to the principle of the invention, but only as conveyor and guide rollers and as squeeze rolls for sealing. The rollers have the advantage of their simple and robust structure and insertion into a processing unit. In contrast to known conveyor rollers or pressure rollers, however, these wiping rollers with their coatings have the function of achieving the discussed mechanical wiping effect, i.e., their rotational speed deviates deliberately from the transport speed of the items to be processed which bear against them. At the same time, these rollers can also be designed as a counter-electrode to the object to be processed. The aforementioned deviation in speed can be achieved by means of the respective values of the aforementioned speeds and/or their respective directions. At this point, it should also be noted that the aforementioned speed deviation and/or relative speed may be low, almost zero.

Furthermore, the wiping rollers with their coating can mechanically favor the carrying away of particles. This is especially true when the rollers are pressed with a certain pressure force onto the surface of the items to be processed. In this way, disruptive layers on the cathode, such as gas bubbles suspended on the surface, can also be removed.

Further preferred design forms for reinforcing the metallization of the inner wall of drill holes consist of means and devices for conveying the electrolyte through the drill holes (flooding) with appropriate overpressure or underpressure.

Further advantages and features of the invention are found in the description which follows and in the accompanying drawings of possible designs according to the invention.

Figure 2:
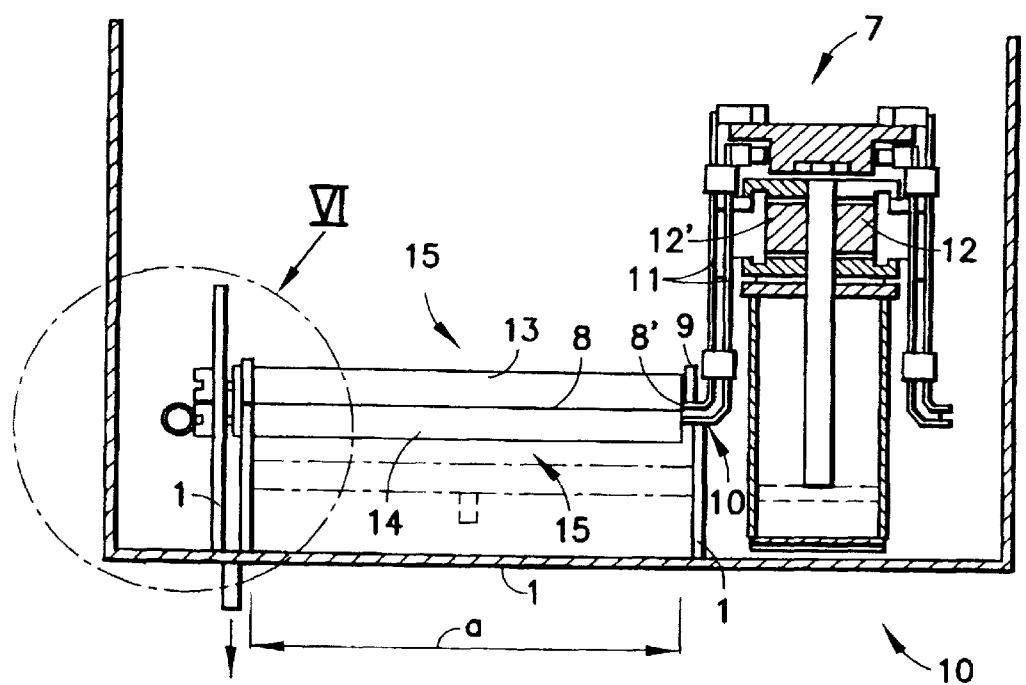
FIG. 2 A design for implementing the process or processes according to the invention, in front view and partially in section.
Figure 3:
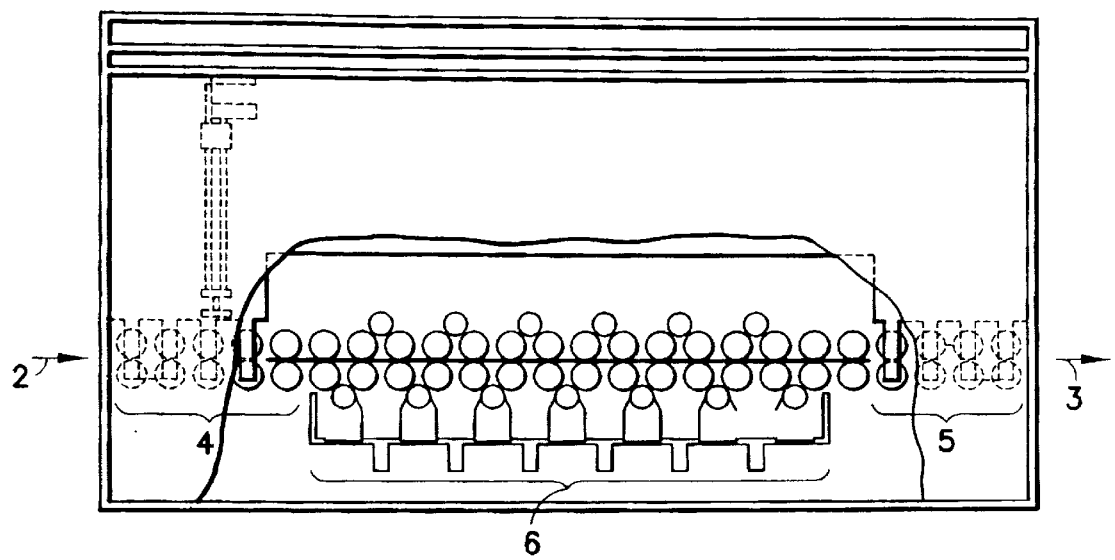
FIG. 3 The side view associated with FIG. 2.
Figure 4:
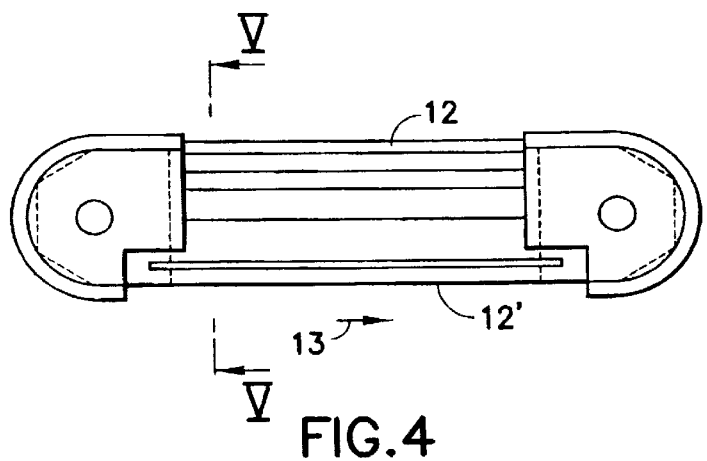
FIG. 4 A top view of the conveyor device in FIGS. 2 and 3.

Compared to FIGS. 2 to 4, the following figures are drawn in larger scale.

Figure 5:
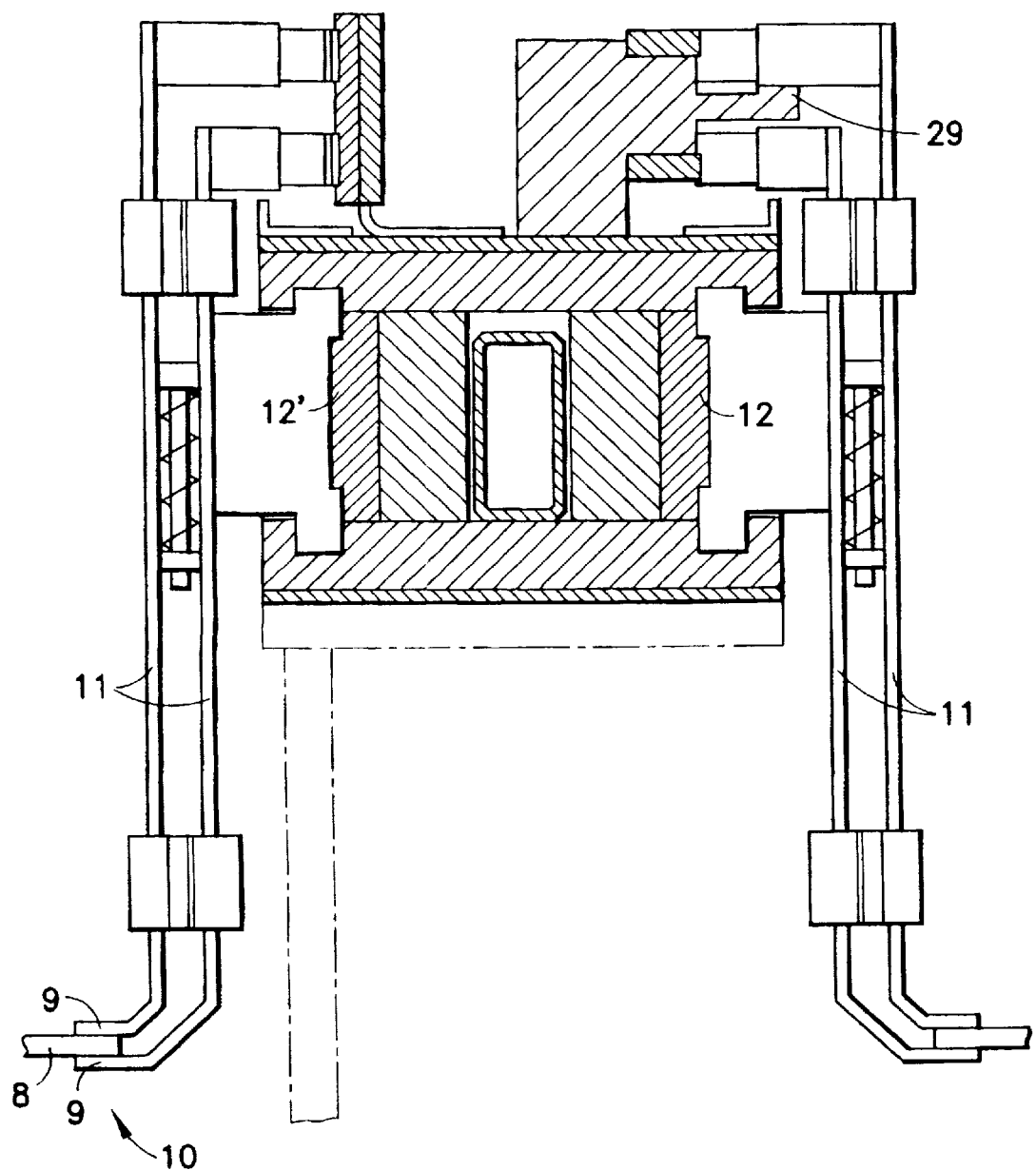
Figure 6:
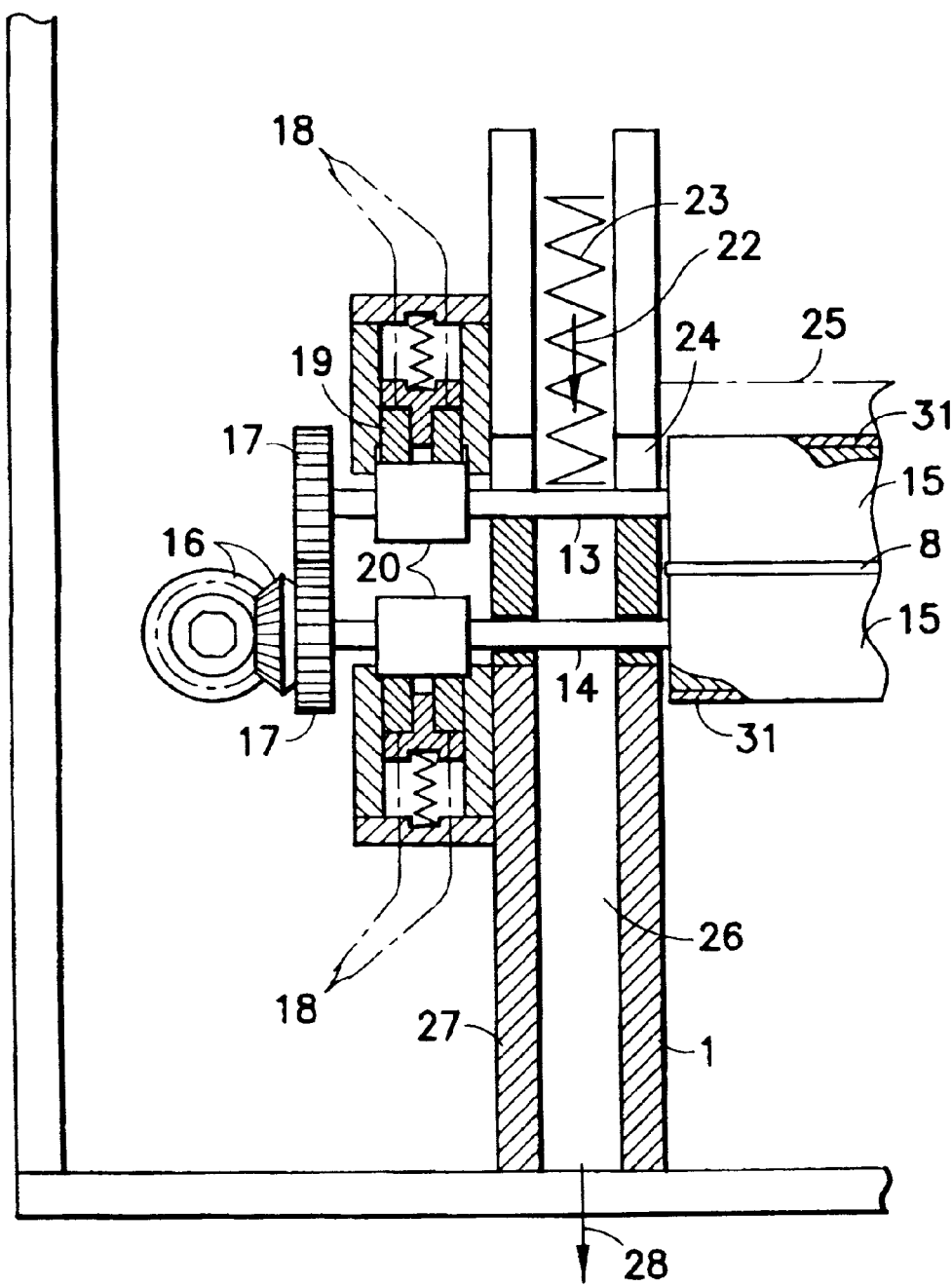
Figure 7:
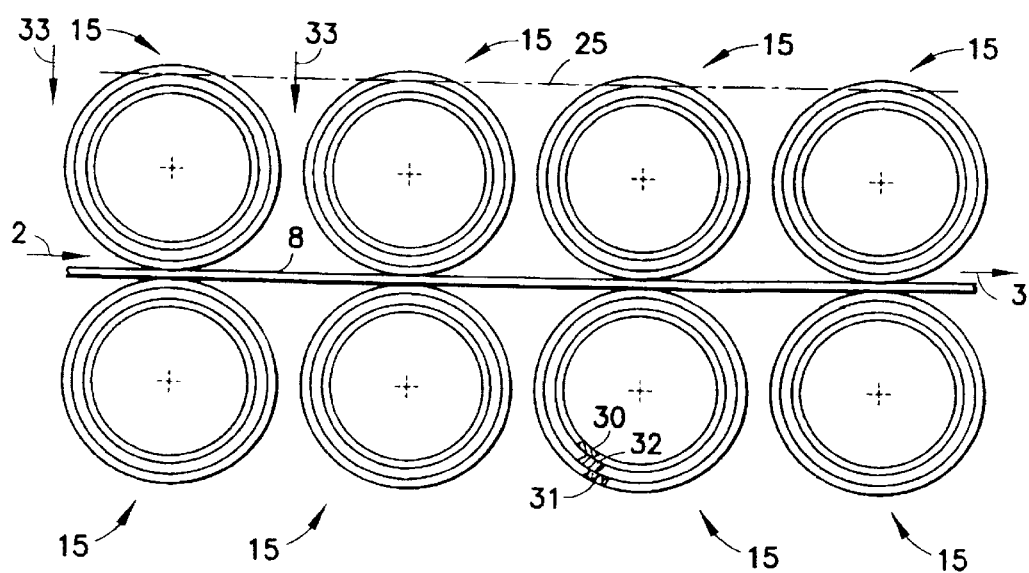
Figure 8:
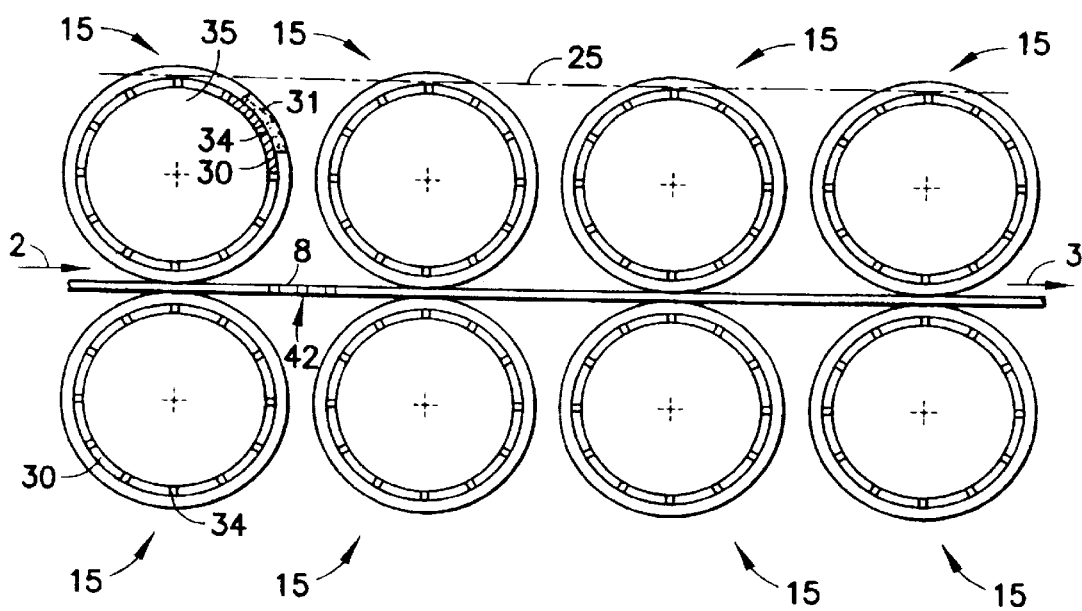
Figure 9:
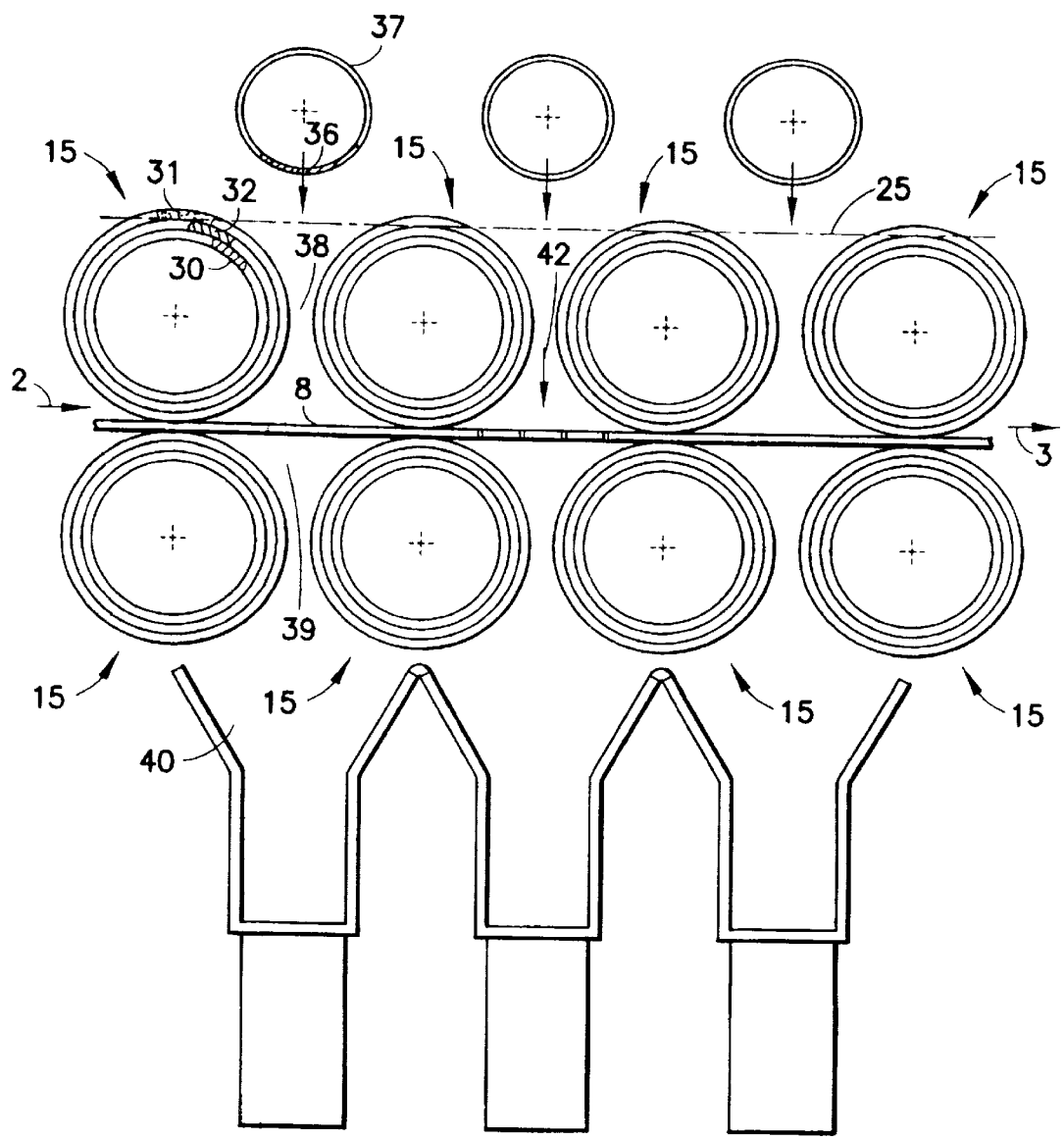
Figure 10:
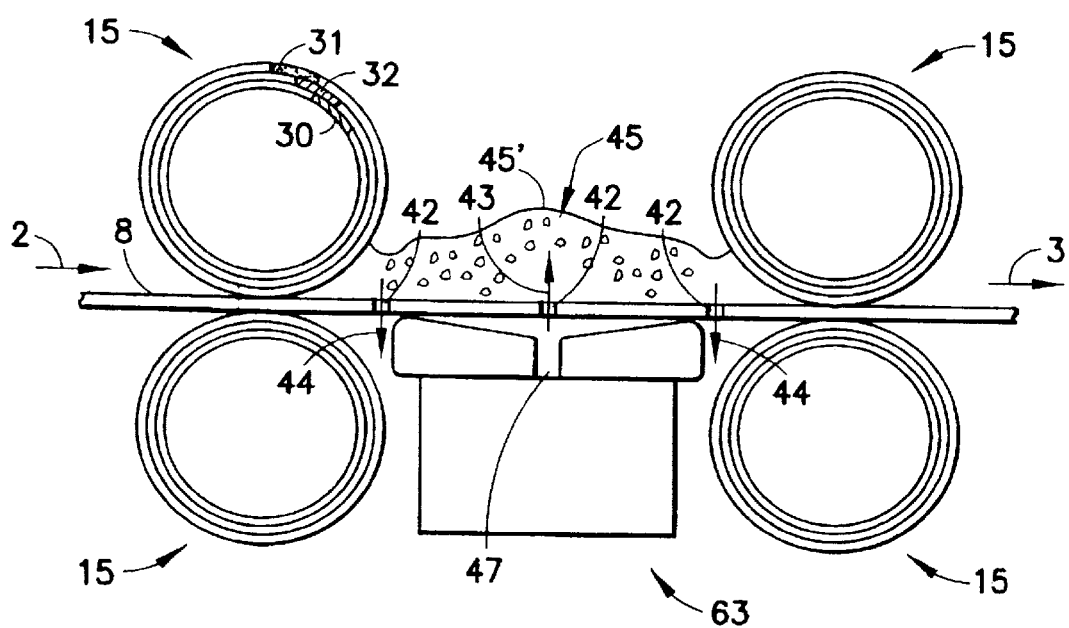
Figure 11:
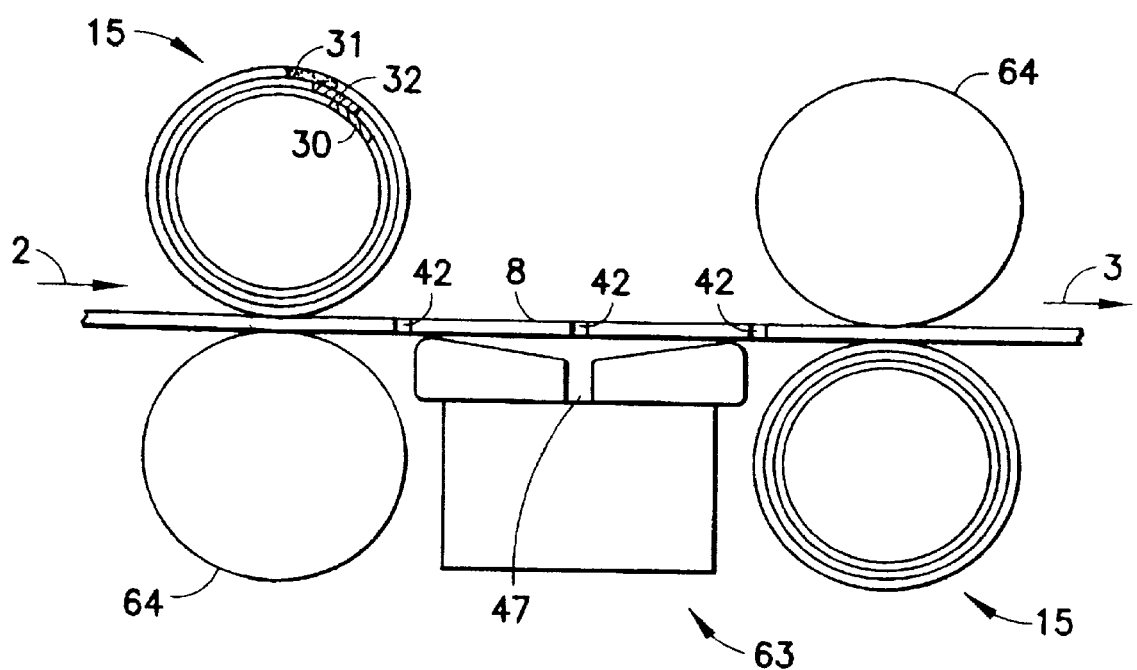
Figure 12:
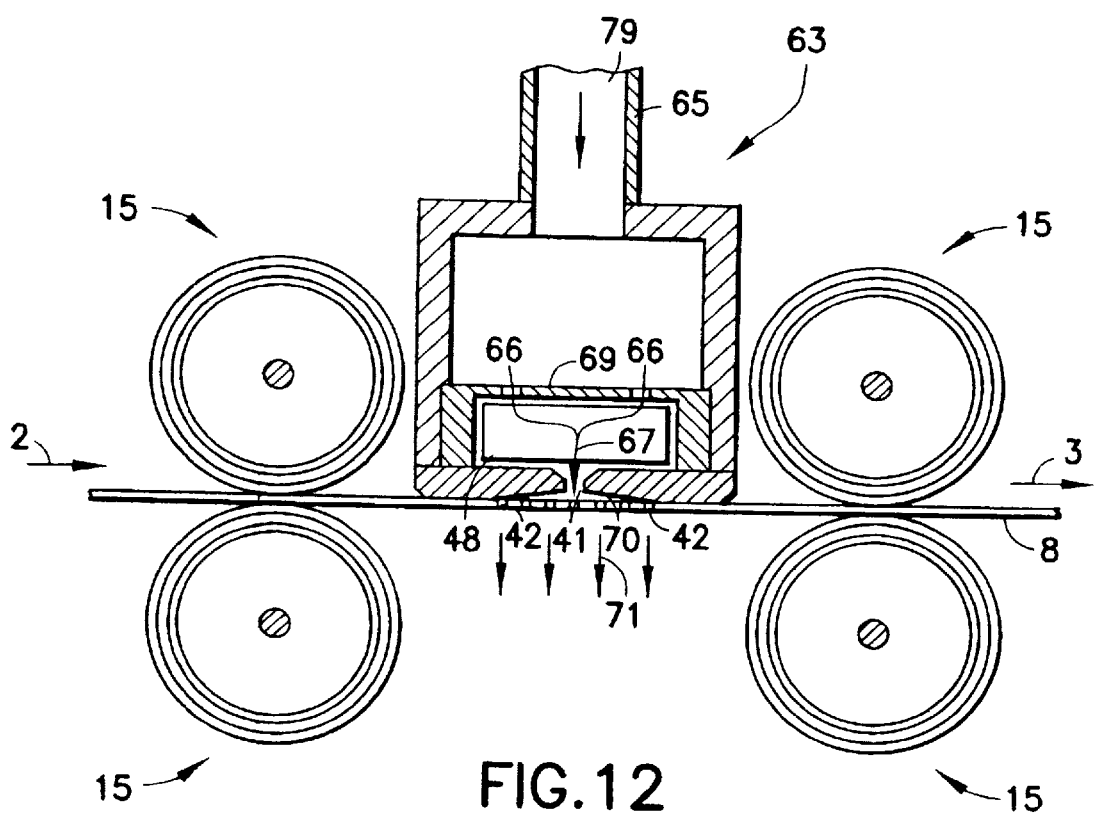
Figure 13:
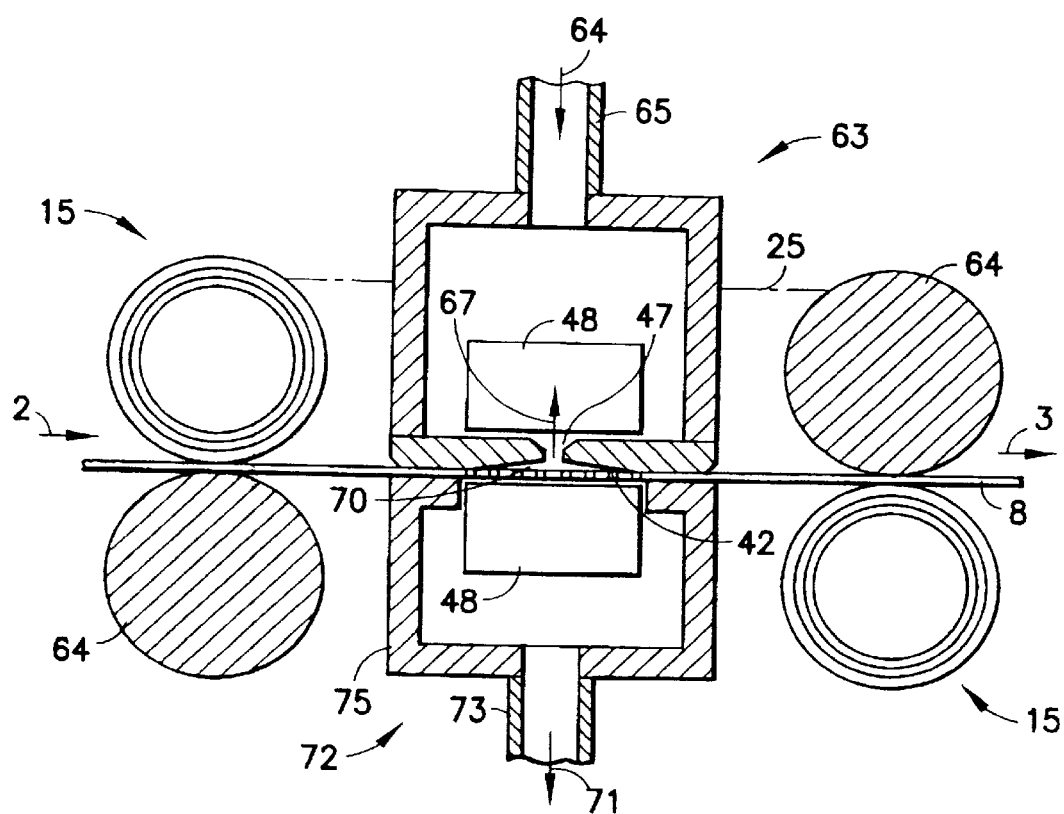
Figure 14:
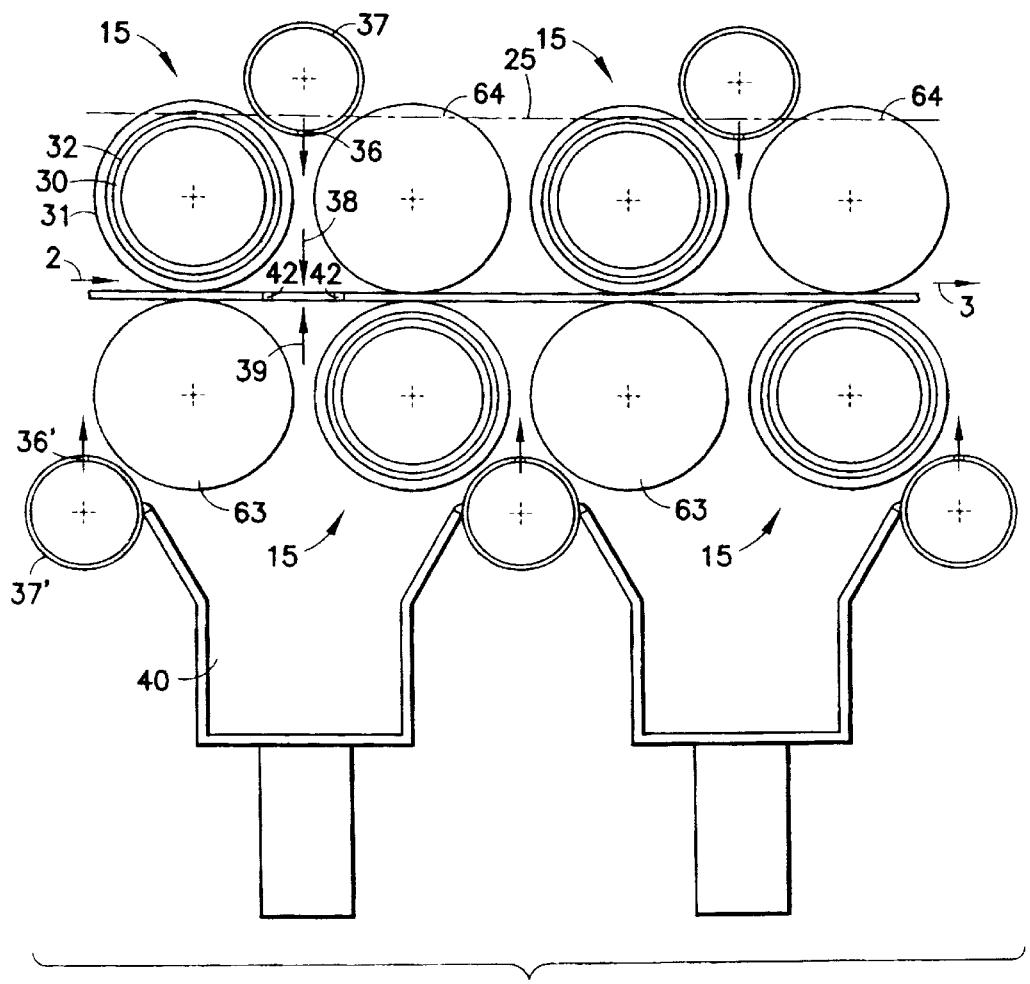
Figure 15:
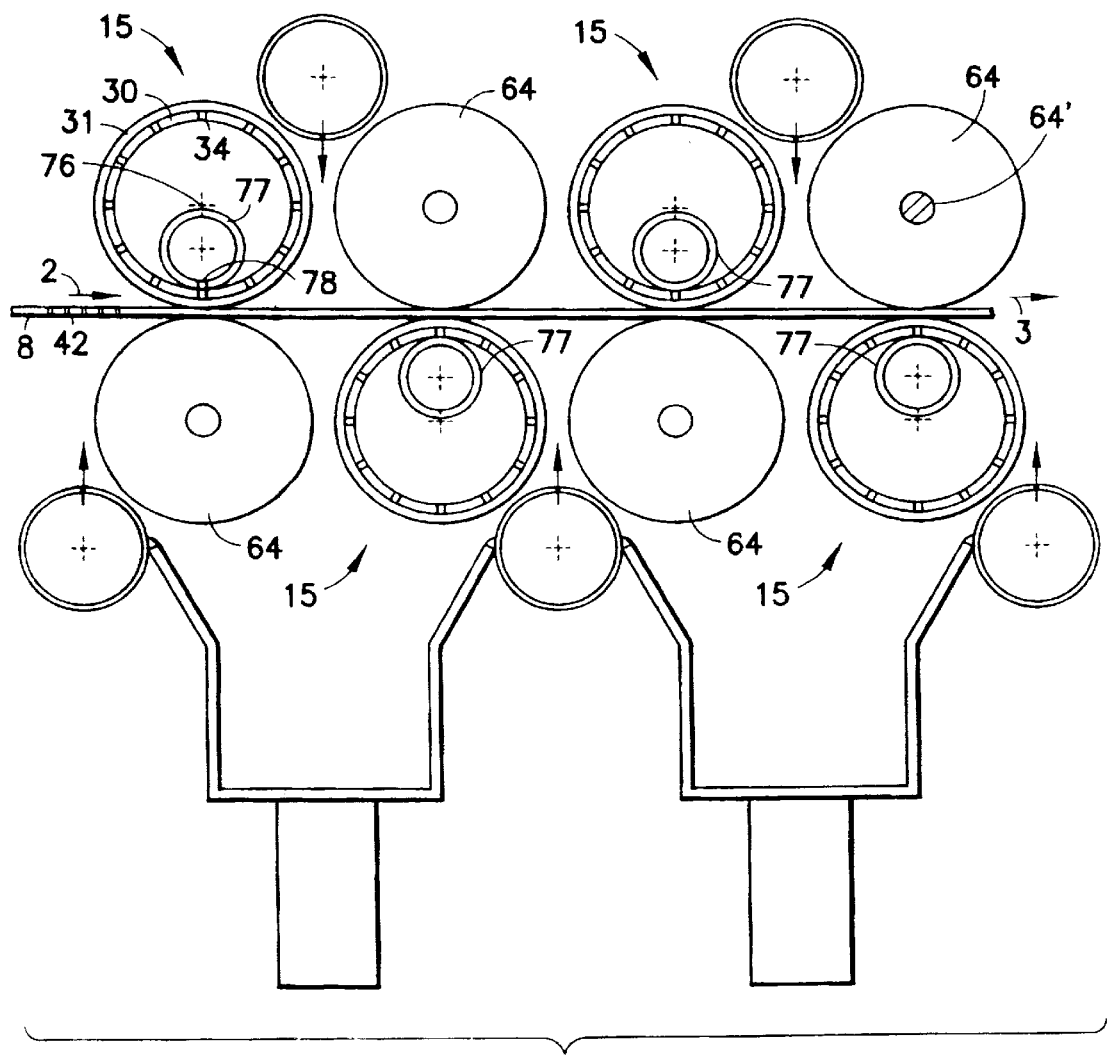
Figure 16:
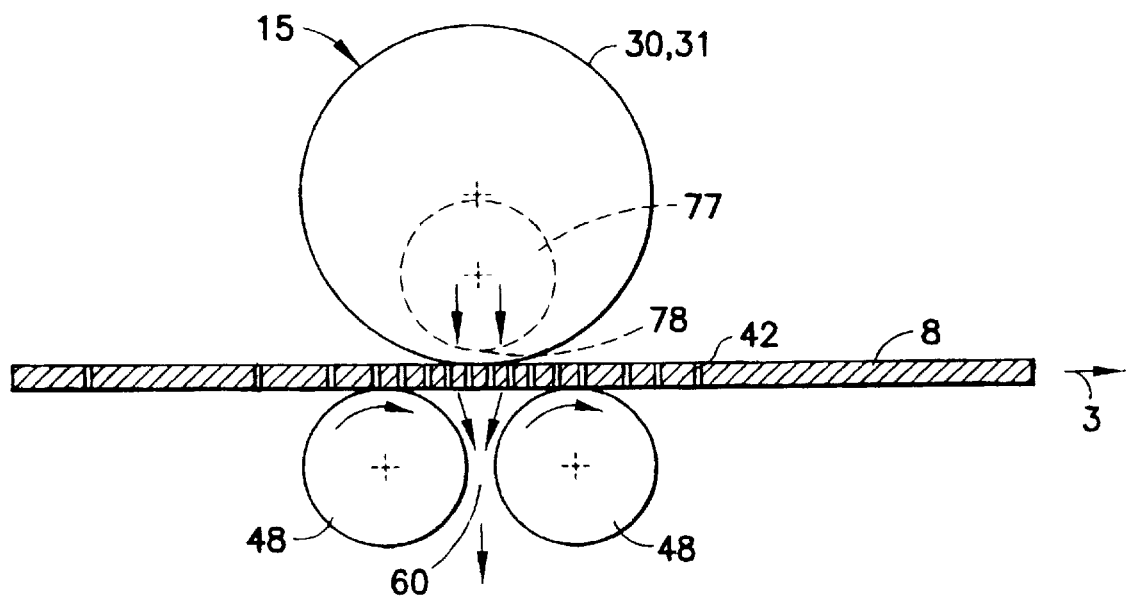
Figure 17:
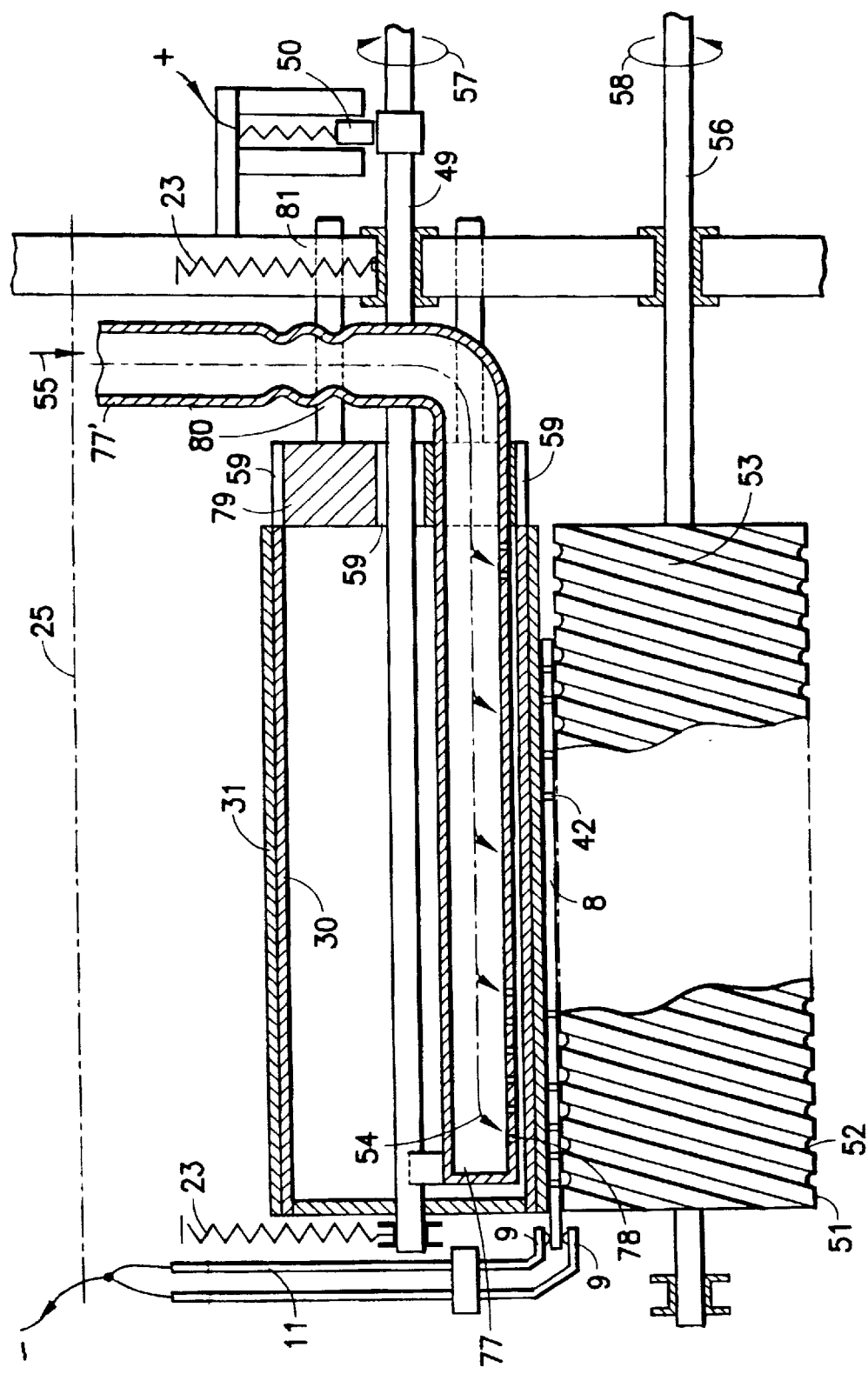

FIG. 5 The conveyor device according to Line V—V in FIG. 4, in section;

FIG. 6 The Detail VI circled in FIG. 2, in enlarged scale and partially in section;

FIG. 7 A first example of the embodiment and arrangement of the wiping rollers;

FIG. 8 A second example of the embodiment and arrangement of the wiping rollers and the flooding;

FIG. 9 A third example of the embodiment and arrangement of the wiping rollers, also showing the supply and extraction of electrolytic fluid and the flooding;

FIG. 10 A fourth example of the design and embodiment of wiping rollers, as well and in the supply and extraction of electrolytic fluid and the flooding;

FIG. 11 A fifth example of the embodiment and arrangement of wiping and carrying rollers and the supply of electrolytic fluid, as well as the flooding;

FIGS. 12, 13 A sixth and seventh example of the invention with wiping and flooding means;

FIG. 14 An eighth example of the embodiment and arrangement of wiping and carrying rollers and the supply of electrolytic fluid, as well as the flooding;

FIG. 15 A ninth example of the invention showing the design of the wiping rollers and an associated conduction of the electrolyte, as well as the flooding;

FIG. 16 A further (tenth) example of the invention for achieving the flooding and wiping effect;

FIG. 17 A further (eleventh) example of the invention for achieving the flooding and wiping effect.

Figure 1:
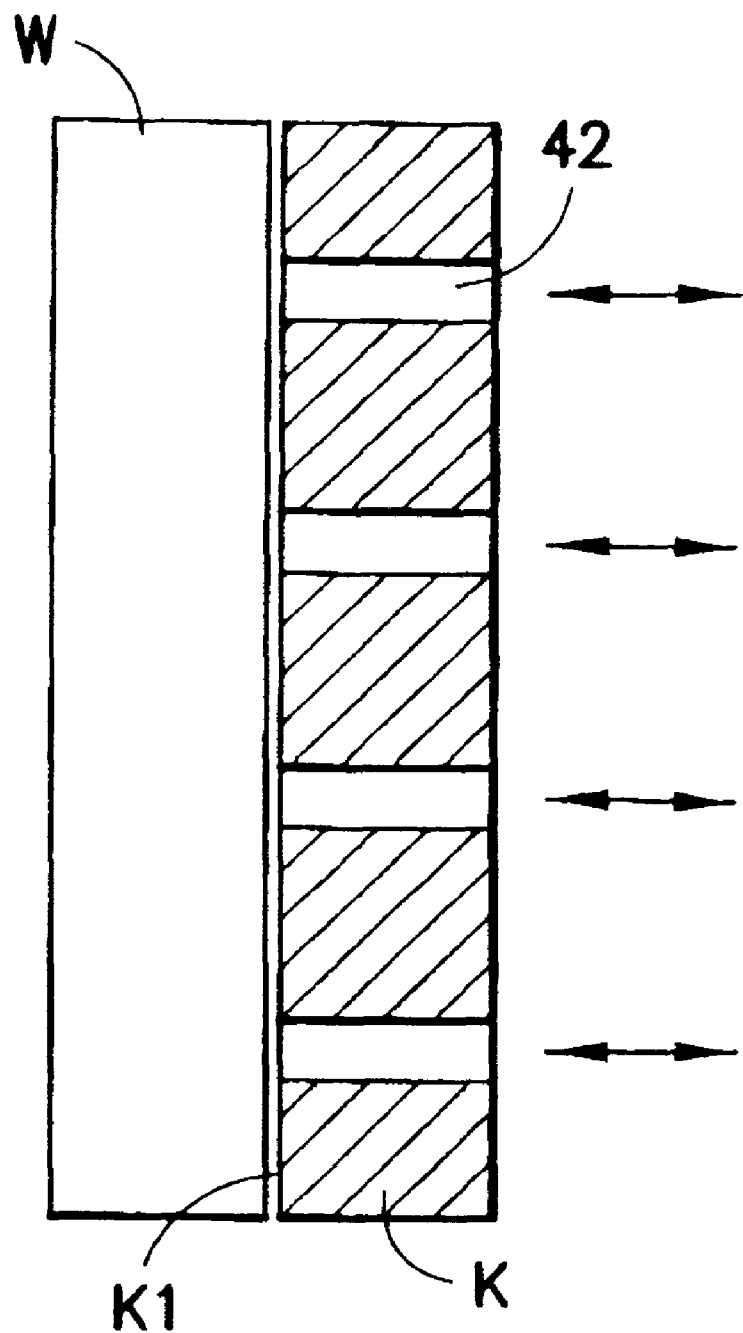
FIG. 1 A depiction, partially in section, of the process according to the invention in principle.

The diagram in FIG. 1 shows the principle of the invention. In schematic fashion, FIG. 1 shows the principle of the invention in the case of a cathodic item K with the area K1 to be treated and the wiping device W associated with this. This wiping device W has the anodic function. The aforementioned wiping device may be wiping rollers according to the examples below or may be another wiping device. In any case, the wiping process is carried out mechanically. This process may be carried out on an item conveyed through a series of treatment baths, i.e., essentially continuously, but it may also be carried out on an item which is introduced into one of the treatment stations or into a treatment bath and processed there. In the latter case, the wiping operation and the flooding operation explained below are discontinuous. In the case of a flat item, either one of its two surface or both of its surface can be wiped. At the same time, the electrolyte is conducted through the drill holes ("flooding"). The examples discussed below will make refer to details of the above sequence.

FIGS. 2 to 6 show the aforementioned main possibility for use of the invention, namely, a bath station of a galvanization unit that is designed according to the invention, including the conveyor means for the items to be processed. A series of such bath stations can be provided one behind the other, in order to allow processes to be carried out with various baths.

The bath container 1 contains a bath liquid, not shown. An item to be processed which is introduced in the direction of the arrow 2 is conducted between guide rollers, conveyor rollers and the wiping rollers, which will be discussed in more detail below. The item can be transported and processed horizontally according to this example of the invention. After processing, the item emerges from the unit in the arrow direction 3. In the areas 4 and 5, only conveyor and/or guide rollers are present and shown, whereas in area 6, in addition to any conveyor and/or guide rollers, there are also wiping rollers according to the invention. The wiping rollers are explained in detail in reference to several examples in FIGS. 6 to 12, whereby Section 6 in FIG. 3 corresponds to the examples in FIGS. 7, 8 and 9.

The movement path for the items to be treated has the position and breadth designated in FIG. 2 as "a." In FIG. 2, the movement direction 2–3 runs vertical to the plane of projection. In this example, a conveyor device 7 is located next to the movement path of the items to be treated, which uses conveyor means in the form of a clamp 9 to grasp in clamping fashion a flat item 8 on a lateral edge 8' and move the item 8 in the movement direction 2–3. Such a conveyor device is the subject of DE-OS 36 23 481, to the disclosed contents of which reference is hereby made. However, the invention is not limited to the use of a conveyor device designed in this manner. This lateral grasp of the flat item by the clamps 9 has a special advantage, especially in conjunction with the discussed "flooding," i.e., pressing or drawing electrolyte through the drill holes of the item. During flooding, a corresponding pressure on the item arises in the flooding direction. The clamps with their firm lateral grasp on the item prevent the board in question from being pushed by the flooding pressure. The aforementioned drill holes and the means for flooding are not shown in FIGS. 2 to 6, for the sake of simplicity. Reference is again made to the examples which follow. A clamp 9, consisting of two clips 11, forms a conveyor means 10. All conveyor means are attached to a continuously rotating conveyor belt 12, 12', which rotates in the direction of the arrow 13 (see FIG. 4). When the conveyor means 10 are located on the side of the strand 12' (see FIG. 3) of the conveyor belt, then the clamps 9 are in the holding position (see the drawing of the left side of the conveyor device 7 in FIG. 2). As soon as the conveyor means 10 move out of the area of the strand 12' into the upper strand 12 in FIG. 4, the two clips 11 of the clamps 9 are pulled somewhat apart, so that a space exists between them (see the right side of the conveyor device 7 in FIG. 2). This conveyor device moves the items at a particular and if necessary adjustable speed in the direction 2–3.

FIG. 5 shows the conveyor device in detail. It can be seen that in the area of the strand 12, through the ascent of one of the clips 11 of a clamp onto a guide part 29, the associated clamps 9 are moved into the open position. In contrast, in the path area of the strand 12', such a guide part 29 is not present, and the clips of the clamps 9 lie, under the influence of a pressure spring, with corresponding clamping force at the edge 8' of the item (transport position).

Detail VI in FIG. 2, as well as FIG. 6, which depicts this detail, partially in section, show two wiping rollers 15, which are moved in opposite directions by a drive via a toothed gear 16, 17. For this purpose, there are two spur wheels 17, which sit on the axles 13, 14 of the wiping rollers 15 and mesh with one another. The anodic wiping rollers 15 are connected via contact disks 20 and current contacts 19 which slide thereon as well as by leads 18 to the positive pole of the current source. The cathodic item 8, shown here only partially, is connected to the negative pole of the current source (not shown). Each of the wiping rollers is, on its outer circumference, provided with a coating 31 of a material which absorbs and is permeated by the electrolyte and the metal ions of the electrolyte. This material should be elastic and have a certain softness, in order not to damage the surface of the items during the course of sliding along. The coating must be chemically resistive against the electrolyte. The material preferably used for this is a felt-type plastic, e.g., of polypropylene. Here the term "felt-type" refers not to the textile felt, but to a structure of interwoven components. Such materials are also known for use in filters. The coating may also consist of an open-pore plastic which has good liquid permeability and is friction-proof. This wiping coating should—as should wiping coatings of other materials—be elastic, so that during application to the surface to be wiped it compresses somewhat and then can return to its original form. The aforementioned permeability to fluids is at least necessary when, according to one of the following examples, the electrolyte is pressed from the roller interior through the coating to the outside, or is drawn in in the opposite direction.

While any drive rollers and/or guide rollers (see Number 3 and 4) which might be present have a rotational speed which corresponds in value and direction to the transport direction 2–3 and the transport speed of the conveyor means 10, the rotational speed and/or running direction of the wiping rollers is such that the circumference of the wiping rollers 15 moves relative to the respective surface of the transported items 8. In this way, a wiping effect is exercised on tie surfaces of the items 8 along the entire length of the wiping rollers 15.

The length of the wiping rollers 15 extends across the breadth of the items to be processed, which runs at a right angle to the transport direction, i.e., approximately the amount "a" in FIG. 2. However, an item of lesser breadth can also be processed, whereby a partial length of the wiping device 15 simply goes unused. The level of the electrolytic bath is indicated with a broken line by reference number 25, whereby the item to be processed as well as the wiping devices are located below the level in the bath fluid. This also holds true for the other examples. As the present example shows, it is advisable, or is as a rule necessary, to process an item according to the invention on both of its sides or surfaces, i.e., on the upper surface in FIGS. 2, 3 and 6 as well as on the lower surface, as reflected by the arrangement of two wiping rollers 15, which bear against the respective surfaces of an item from above and from below. In cases in which only one of the surfaces of an item needs to be processed, then the use of one wiping roller suffices in principle. The fact that more than two wiping rollers can be used is illustrated by the examples in FIGS. 7 to 15.

As a rule, a certain pressure force is recommended between the coatings 31 of the wiping rollers and the surfaces of the items to be processed, which pressure force, for example, can be applied by a spring 23 pressing in arrow direction 22 and indicated schematically in FIG. 6. In order to be able to process items of varying thickness, the upper roller of the wiping rollers 15 is mounted in a slot guide 24 and can therefore, when there is an increase in the thickness of the items to be processed, give way opposite to the arrow direction 22. The bath level 25 of the electrolyte is higher than the lower edge of the slot. Excess electrolyte can therefore run out through the slot guide 24 and a space 26 between the side wall of the bath container 1 and another externally located wall 27 according to arrow direction 28.

The rotational speed and/or rotational direction of the anodic wiping rollers 15 at their contact points with items having a certain transport speed may be altered and adjusted to the desired value through a control of the drive unit of the wiping rollers. It is also possible to adjust the pressure force of the spring 23 or other pressure means. In this way, particular requirements can be matched with the goal of achieving the most extensive possible disruption of the diffusion layer on the surface of the items in which ion depletion usually occurs.

In the description which follows of examples according to the invention in the design and arrangement of wiping rollers 15 or wiping parts which act accordingly, only these components of the invention, including supply and extraction conduits for the electrolyte, are depicted and explained. Of course, this includes conveyor means for the items and drive means for the wiping parts as well as current feeds, which are depicted in FIGS. 2 to 6, for example, and discussed above. In addition to the conveyor means described there, or instead of these conveyor means, it is also possible, for example, to provide conveyor rollers between every pair of wiping rollers, whereby the cathodic current feed occurs by means of loop contacts on an edge area of the items to be processed. If not already depicted in the drawing, the items to be processed has drill holes, and means are provided for "flooding" these drill holes, i.e., for passing the electrolyte through them.

Basically, the pans located in the electrolytic bath, such as the tube 30 and the expanded metal piece or wire screen 32 described below, must consist of a material which is not attacked in the bath under the electrolytic conditions. Suitable materials include, for example, titanium, titanium coated with platinum, noble metal, noble metal coating or noble metal oxides. This can be done, e.g, according to the example in FIG. 7, in such a way that wiping rollers in the form of metal tubes 30 are provided with the aforementioned felt-type coating 31 and an expanded metal piece 32 located therebetween, which positively connects the tube 30 and the coating 31. Instead of the preferred tubular expanded metal piece mentioned above, a preferred tubular wire screen that is welded at the wire crossing points can also be used or a perforated tube can be provided. In this example, the tube 30 constitutes an insoluble anode, which does not give off metal itself, but rather has emits only current. In this case, the metal to be deposited is located in the electrolyte. However, it is also possible to store the metal to be deposited as a soluble anode in the tube 30 or in another wiping element. When the items 8 are run through, the coatings 31 are somewhat compressed. The electrolyte is supplied according to the arrows 33. This can also be done under pressure. Here, too, the electrolyte passes through the drill holes (not shown) of the board to be processed. As will be mentioned later (at the end of the description), any feature or detail depicted in one of the examples may also be used in the other examples. This applies especially to the means for implementing the flooding of the drill holes 42 of the items to be processed. This example and the others show that the distance between the anode (here the titanium tube 31) and the cathode (identical to item 8) is very small, so that practically no scatterings occur.

The example in FIG. 8 resembles that in FIG. 7. However, FIG. 8 shows one of the possible designs for allowing the electrolyte to flow through drill holes 42 of the items to be processed. For this purpose, the tubes 30 are provided with perforations, which have several functions. First of all, the electrolyte is supplied in the tube interior 35 and passed along through the perforations 34 to the coating 31. Furthermore, the electrolyte is conducted from the interior of the tube 30 through the perforations 34 of the tube and the wiping coating to the drill holes 42 of the board 8; the electrolyte then flows through the latter and reaches the interior of the counter-roller in question, the tube 30 of which is likewise provided with perforations 34. The electrolyte in one tube can thereby be under pressure from a pump and the electrolyte in the counter-roller located on the other side of the items to be processed can be drawn out of the drill holes. In addition, the perforations 34 can also serve to ensure that the material of the coating 31 clings within them. In this preferred design, only the inner tube 30 and the outer coating 31 are provided. Instead of the tube 30 with the perforations 34, a tubular expanded metal piece or wire screen can also be used.

Of course, the wiping coating 31 surrounds the wiping roller 15 in question on its entire circumference. This is true for all examples that show wiping rollers. The wiping rollers are generally indicated by the reference number 15 and an associated arrow, regardless of their somewhat different embodiments.

In the example shown in FIGS. 9 to 14, the structure of the wiping rollers is the same as in FIG. 7, namely of an inner tube 30, an expanded metal piece or the like (see above) 32 and the coating 31 which surrounds the wiping roller and thus the tube 30 as well.

In the example shown in FIG. 9, the electrolyte is supplied by means of supply tubes 37 having perforations or slits 36, which are located above the free space 38 between two wiping rollers 15. After the electrolyte runs through the intermediate spaces 38, the drill holes 42 and the intermediate spaces (39) located thereunder, it is collected by collection containers 40 and conducted to a filter pump.

When an upper wiping roller and a lower wiping roller located opposite to one another are provided (for example, in the design according to FIG. 9, then, in alternating fashion, the upper wiping roller can be connected anodically and the wiping roller located under it can be connected as the cathode, and vice versa. Such a process and an associated arrangement are depicted and described in the older patent application P 41 06 333.3-45 of the applicant. Reference is hereby made to its disclosed contents.

The example in FIG. 10 also shows wiping rollers 15 in the design according to FIG. 7 during the processing of flat items 8, especially printed circuit boards, which are provided with drill holes 42. The electrolyte is conveyed with pressure through the slit 41 of a flow nozzle 63 upward (arrow 43) through the drill holes 42 located thereover and from here conveyed back by means of underpressure through the drill holes 42 (arrow 44) located near the flow nozzle 63.

As this happens, a certain pool 45 of electrolyte (with the electrolytic surface 45') builds up above the items 8 to be processed, and this pool provides electrolyte to the coatings of the two wiping rollers located above the items 8, while the wiping rollers below the items 8 are moistened through the electrolytic flows 44 as well as through the electrolyte flowing across the edge of the flow nozzle top. The latter electrolyte achieves a high speed in the narrow gap between the items 8 and the flow nozzle, as the result of which lower pressure is created than exists in the electrolyte above the flat items. This difference in pressure causes the electrolyte to be drawn through the drill holes 42. Such an flow nozzle arrangement can be provided, alone or in combination with other means which facilitate "flooding" (see the other examples in this regard), in order to convey the electrolyte through the drill holes 42.

The means which can be used for the purpose of flooding according to the invention can also eliminate diffusion-poor layers in the drill holes 42, so that sufficient metal precipitation takes place on the inner walls of the drill holes. In addition, the wiping effect of the coatings of the wiping rollers on the upper and bottom sides of the items, disturbs the surface tension of the fluid columns located in the drill holes 42, thus supporting the desired effect. As mentioned earlier, the process measures and the means for wiping the surfaces of the flat items to be processed and for flooding the drill holes 42 of the flat items therefore work together functionally and synergistically.

The example in FIG. 11 is a variant of the example in FIG. 10. Here the left roller pair has an upper wiping roller 15 and a lower pressure roller 64, and the roller pair shown on the right has an upper pressure roller 64 and a lower wiping roller 15. The pressure rollers can function as conveyor rollers or support rollers, which accordingly bear with pressure against the items to be processed. Each of the anodic wiping rollers 15 wipes, in the sense of the invention, the surface of the item 8 which faces it and also wipes, at the same time, the end of the drill holes 42 which faces it. Furthermore, a flow nozzle 63 is also provided here, as in FIG. 10. A sequential galvanization of the drill holes 42 from alternating sides in the transport direction 2–3 is achieved. The aforementioned conveyor rollers 64, at least on the upper side of the item, are designed as rollers which extend across the entire breadth of the items or the treatment path, so that the electrolyte becomes blocked up on the items 8, while the conveyor rollers on the bottom side of the item may also consist of several disks arranged on one axis, between which the electrolyte can flow.

FIGS. 12 and 13 show further possibilities for the use of a flow nozzle 63. According to FIG. 12, two pairs of wiping rollers 15 are provided in front of or behind an arrangement which has the flow nozzle 63 with the anode 48 arranged therein. The electrolyte flow enters in direction 79 through a connection piece 65, passes through a pre-chamber 68 and a distribution mask 69 with perforations 66, flows (reference number 67) along the anodes 48 consisting of individual pieces, passes through the slot 41 and the nozzle area 70 as well as through the drill holes 42 of the items 8 downward (arrow 71) into the area below the items 8. In detail, reference is made here to the disclosed contents of DE-OS 39 16 693.7. These examples also involve flat and perforated items to be processed, preferably printed circuit boards.

FIG. 13 shows a design similar to the arrangement according to FIG. 12, and the same reference numbers are used. The difference is that in the object in FIG. 12 the electrolyte, after passing through the drill holes 42, flows freely downward, while in the object in FIG. 13, a suction segment 72 with the housing 75 is provided between this outflow 71 and the exit of the electrolyte from the drill holes 42. An underpressure is produced in this via the suction connection piece 73, so that the electrolyte, after passing a further anode 48, is drawn into the space 74 under low pressure and then is extracted from there through the connection piece 73. In connection with the object in FIG. 13, reference is made to the disclosed contents of DE-OS 39 16 694.5.

In the examples in FIGS. 10 to 13, the flow nozzle 63 extends across the entire breadth of the treatment items, i.e., the breadth "a" in the example from FIG. 2. The same applies for the space 68 (FIGS. 12 and 13), in which the electrolytic fluid enters via a series of connection pieces 65 arranged one behind the other at a right angle to the items. In the example in FIG. 13, the suction segment 72 of the suction side extends likewise across the entire breadth "a." In these examples with the flow nozzle 63, it is thus ensured that, according to the invention, in addition to the surface treatment of the items 8 through the wiping roller 15, there occurs an intensive flowing through of the item drill holes 42 by the electrolyte, which in fact flows the entire breadth "a" of the work pieces conveyed in direction 2–3. This type of intensive electrolyte flow through the item drill holes 42 and the correspondingly heavier deposit of metallization on the inner walls of these drill holes, in combination with the previously described galvanization of the surfaces of the items due to the wiping effect, would not be possible in the arrangement according to the prior art, in which the electrolytic flow is conducted at great speed parallel to and along the work piece surface. In this case, it would not be verifiable in terms of flow engineering that the electrolytic flow passed through the drill boles at a right angle to the flow direction.

The example in FIG. 14 contains a combination of the arrangement of wiping rollers and pressure rollers according to the example in FIG. 11, with a conduction of the electrolyte as in the example in FIG. 9. The same reference numbers are used as in FIGS. 9 and 11. In addition, lower conduits 37' with exit openings 36' for the electrolyte are also provided, which convey the electrolyte upward from below.

The example in FIG. 15 shows a modification of the example in FIG. 14. The wiping rollers 15 here, analogous to the design discussed in reference to FIG. 8, consist of an inner tube 30 provided with perforations 34 or a tubular expanded metal piece or a tubular wire screen in which the wires are welded at their crossing points, as well as of the discussed coating 31. Within the tube 30 which encircles its axis 76, there is a non-rotating supply tube 77, into which the electrolyte is introduced in a manner not shown here; the electrolyte then emerges through passage openings (e.g. perforations) or passage slots 78 in the wall of the tube 77 which are arranged one behind the other in the longitudinal direction of the tube. Of course, the supply tube 77 with the passage openings or slits 78 extends across the entire length of the tube 30 and thus the entire breadth of the items 8 to be processed. The passage openings or slits 78 point with their inlets or outlets toward the movement path 2–3 of the items 8, so that the electrolyte flowing through these passage openings or slits 78 of the supply tube 77 emerges through the perforations (or corresponding slits) 34 of the tube 30 vertical to the items 8 onto the latter and passes through the drill holes 42. Thus the flow speed of the electrolyte through the perforations or slits 78 and the perforations 34 causes a corresponding vertical flow through the drill holes 42 of the boards 8 and therefore also causes improvement in the metal precipitation there. In this example, the electrolyte in the supply tube 77 may either be under pressure and pressed through the perforations or slits 78 and the drill holes 42, or else a lower pressure and thus a suction effect is produced in the interior of the tube 77, which draws the electrolyte through the drill holes 42 and the perforations or slits 78. In the latter case, any particles of the wiping coat that have gotten into the drill holes 42 can be removed and carried away via the tube 77 and later filtered out of the extracted electrolyte. Of course, in the example in FIG. 15 as well as in the other example, a series of holes 34 are distributed continuously around the circumference of the roller 30. The aforementioned tube 77 can be located in a wiping roller or above or under the items to be processed. Pressure rollers or disks 64 are also shown here, which rotate around the axis 64' and serve as support roller or transport rollers for the items 8 conveyed through. The wiping roller 15 can also be surrounded by a cover that tightly encompass the surface of the wiping roller 15 on all areas except for a portion of the surface where the roller touches the printed circuit boards.

FIG. 8 shows, schematically, above a flat item 8 provided with drill holes 42, e.g., a printed circuit board, a wiping roller 15 in the form of a flooding anode, which corresponds to the parts 30, 31, 77, 78 of the example in FIG. 15. These parts are only indicated here in schematic fashion. If a pressure of the electrolyte is formed in the supply tube 77, the electrolyte flows downward, according to the arrows, through the drill holes 42. If, on the other hand, an underpressure is created in the tube interior 77, then the electrolyte flows opposite to the indicated arrow direction. This example shows, as counter or pressure rollers, two counter rollers 48 driven in the arrow direction and thus also in the transport direction 3 of the board 8, which rollers leave such a broad space 60 free under the perforations or slits 78 of the supply 77—and thus in the flow direction of the electrolyte—that the electrolyte can flow unobstructed between the counter rollers 48. Nonetheless, due to the arrangement of two counter rollers symmetrical to the wiping roller 15, even distribution of the pressure of the wiping roller 15 on the counter rollers 48 is ensured. These counter rollers are provided on their surface with insulation, or else they consist of plastic.

In longitudinal section, FIG. 17 shows the example of a flooding anode shown only schematically in FIGS. 15 and 16 and identified by the reference numbers 30, 31, 77, 78. The same reference numbers are used as in FIGS. 5, 6, 15 and 16. Reference is made to the associated descriptions of these figures. The flooding anode 30, 31, 77, 78 depicted in the upper area of FIG. 17 can be moved in the vertical direction against the pressure of springs 23 with its bearings and its drive shaft 49. This permits height compensation, so that boards 8 of varying thickness can be processed. The current feeds occur via clips 9, 11, which are connected to one pole of the rectifier and connect the latter to the items to be processed, as well as through loop contacts 50, which are connected to the other rectifier pole and connect the latter to the drive shaft 49 of the flooding anode.

Furthermore, there is a pressure or counter roller 51 consisting, at least on its surface, of a material that is not electrically conductive and provided at its circumference with drainage grooves 52, whereby these grooves form an angle, here an acute angle, with the longitudinal axis 53 of this roller 51. In this way, the electrolyte emerging downward from the drill holes 42 is conveyed away. In this case, as the arrows show, the electrolyte is conveyed through pressure in arrow direction 55 and, according to the arrows 54, is passed through the perforations or slits 78 and then through the drill holes 42 and conducted into the drainage grooves 52. Instead of this, it is also possible for suction to occur at the upper end 77' of the flood tube opposite to the direction of the arrow 55, by means of which the electrolyte is drawn upward from the drainage grooves 52 through the holes 78 and opposite to the arrow direction 54. The flooding anode is driven by its shaft 49 in a rotational direction (see arrow 57) opposite to the rotational direction (arrow 58) of the drive shaft 56 of the counter roller 51. The reference number 50 indicates a loop contact of the current supply to the drive shaft 49. The flooding anode is equipped at one end with inner and outer side slide bearings 59 and 59' for the 30 and the drive shaft 49, respectively. The aforementioned slide bearings 59, 59' are located on the circumference or on the inner diameter of a stationary bearing shell 79, which is held via a stay 80 on a frame of this arrangement not described in more detail and is conducted so as to be vertically movable in a recess 81 by a certain path segment.

In the case of printed circuit boards in which the drill hole walls are first coated only with a conductive layer that cannot tolerate larger current densities, lower current densities are to be used at the beginning in the first part of the processing section 6 (see FIG. 3). Once a sufficient metal layer has been deposited there, then, as items move through Section 6 in direction 2–3, the current density of the galvanization process is increased by measures that are known in themselves.

The process and the arrangement according to the invention are also suitable for the processing of flat items which are suspended vertically in treatment baths and remain there during the treatment. In this way, the inventions provides not only for continuous runs of the items to be processed, but also for discontinuous operation, in which the items are placed in a station and undergo processing there. During this processing, wiping and flooding are carried out. Thus "periodic" wiping and flooding take place during the periods of the bath treatment in question.

All depicted and described features and their combination with one another are essential to the invention for different design forms. Features and details described in one of the examples can also be used analogously in other examples.

We claim:

1. A process for electrolytically processing a flat perforated item, comprising the steps of:

moving the item in a transport direction to a treatment station where the item is contacted with an electrolyte;

continuously mechanically wiping, in the presence of one of a cathodic item and an anode, and an anodic item and a cathode, a surface of the item using means for reducing the thickness of a diffusion layer depleted in metal ions adjacent the surface of the item, which means include a wiping roller extending perpendicular to the transport direction over the entire width of the item and in contact with the item; and moving the electrolyte in a direction substantially perpendicular to a plane of the item as the item emerges from the wiping roller so as to direct the electrolyte only toward the perforations in the item to convey the electrolyte through the perforations in the item under pressure.

2. A process as in claim 1, wherein the wiping step includes bearing the wiping roller, which forms part of the reducing means, directly on the surface of the item in a sliding manner to disturb and at least partially destroy the diffusion layer, and further including moving the item and the wiping roller relative to one another.

3. Process as in claim 2, including creating the relative movement by a transport movement of the item to the wiping roller.

4. Process as in claim 2, wherein the item is cathodic and the wiping roller is anodic, the relative movement step including moving the cathodic item relative to an anode wiping roller, which has a coating of a material that absorbs the electrolyte and allows it to permeate, and bringing the coating directly to bear in a sliding fashion on the surface of the item to be processed, while in order to reduce the diffusion layer in the perforations of the item moving the electrolyte at the same time substantially perpendicular to the plane of the item to be processed so that the electrolyte is conveyed through the perforations.

5. Process as in claim 4, wherein coating on the wiping roller is a resilient coating that can be flattened or pressed.

6. Process as in claim 1, including wiping at least a portion of one surface of the item.

7. Process as in claim 2, wherein the relative speed between the items and the wiping roller is substantially zero.

8. Process as in claim 2, wherein the relative movement step includes imparting to a contact area of the wiping roller which bears on the surface of the item, an independent movement which deviates from the transport movement in at least one of speed and direction.

9. Process as in claim 1, wherein both sides of the item are wiped by separate wiping rollers, the rollers rotating in opposite directions.

10. Process as in claim 1, wherein both sides of the item are wiped by separate wiping rollers, the rollers rotating in a common direction.

11. Process as in claim 1, including increasing a current density of a galvanizing current during the course of the movement of the item through the treatment station.

12. Process as in claim 1, including sucking the electrolyte through the holes.

13. Process as in claim 1, including wiping the surface and conducting the electrolyte through the holes from below a surface level of a bath of the electrolyte and thus within the electrolyte.

14. An arrangement for electrolytically processing a flat item having through holes and a width, comprising:

treatment means for applying electrolyte to the item;

means for transporting the item through the treatment means in a transport direction along a planar transport path;

means for contacting and reducing the thickness of a diffusion layer depleted in metal ions adjacent the surface of the item, the reducing means including a wiping roller arranged perpendicular to the transport direction, and configured so as to wipe at least one surface of the item across the entire width; and means for conveying the electrolyte only toward the holes in the item under pressure in a flow substantially perpendicular to the planar transport path as the item emerges from the wiping roller so as to force the electrolyte through the holes.

15. Arrangement as in claim 14, and further comprising an anode connected to the wiping roller for applying metal.

16. Arrangement as in claim 14, wherein the wiping roller is provided with a coating that is configured to bear against the surface of the item at least during a relative movement between the item and the wiping roller.

17. Arrangement as in claim 16, wherein the wiping roller is configured and arranged to extend over the entire surface area of the item, at least the item being movable relative to the wiping roller.

18. Arrangement as in claim 16, wherein the coating is configured to bear against the surface of the item with an adjustable pressure force.

19. Arrangement as in claim 16, wherein the coating is an open-pore plastic that is liquid-permeable.

20. Arrangement as in claim 16, wherein the coating is an elastic material.

21. Arrangement as in claim 16, wherein the wiping roller has a circumference which is provided with the coating, and further comprising drive means for rotating the wiping roller in a rotational direction and at a circumferential speed which are selectable in order to produce a relative speed between a bearing region of the wiping roller and the surface of the item.

22. Arrangement as in claim 21, wherein the wiping roller includes one of a perforated metal tube, an expanded metal tube and a wire screen tube, and a cylindrical coating surrounding the tube so that the electrolyte is suppliable and extractable from inside the tube.

23. Arrangement as in claim 22, wherein the tube is configured to conduct the electrolyte through an interior of the tube, a passage for the electrolyte being formed between the tube interior, the tube wall and the coating surround the tube.

24. Arrangement as in claim 23, wherein a series of passage openings is provided in the tube wall.

25. Arrangement as in claim 22, wherein the tube has passage openings for the electrolyte, a supply tube for the electrolyte being arranged inside the tube, the supply tube having passage openings that point toward the item, the supply tube and the tube being configured to extend across the entire width of the item.

26. Arrangement as in claim 25, wherein the supply tube is arranged so that the passage openings are in close proximity to the planar transport path on which the item is transported.

27. Arrangement as in claim 25, wherein the supply tube is arranged in the tube in a non-rotating fashion.

28. Arrangement as in claim 25, wherein the tube and the supply tube located therein are provided so as to be movable substantially perpendicular to the planar transport path.

29. Arrangement as in claim 21, wherein the wiping roller includes a metal tube and a cylindrical coating surround the tube, one of an expanded metal and a wire screen being arranged between the tube and the cylindrical coating so as to hold the coating and tube to one another, electrolyte running from a point outside the wiping roller to the holes of the item.

30. Arrangement as in claim 21, wherein the conveying means includes means for generating a fluid stream of electrolyte toward the holes in the item, and further comprising a pressure roller arranged opposite to the wiping roller, the wiping roller being bearable against one surface of the item and the pressure roller being bearable against the other surface of the item.

31. Arrangement as in claim 30, wherein pairs of opposing wiping and pressure rollers are arranged behind one another in the transport direction, whereby, in alternating fashion, in one pair a wiping roller is provided above the item and a pressure roller is provided below the item and in a next pair, a wiping roller is provided below the item and a pressure roller is provided above the item.

32. Arrangement as in claim 30, wherein at least one tube with openings for the electrolyte is arranged between two wiping rollers, and further comprising a collection device provided below the item for collecting the electrolyte.

33. Arrangement as in claim 30, wherein the pressure roller is provided with drainage grooves which serve for extraction of the electrolyte.

34. Arrangement as in claim 21, wherein at least one pair of opposing wiping rollers are provided so that one of the rollers is located above the item and the other roller is located below the item.

35. Arrangement as in claim 16, wherein the coating has a thickness of 1–4 mm.

36. Arrangement as in claim 14, wherein the conveying means includes pressure-producing means for supplying the electrolyte to the holes in the item.

37. Arrangement is in claim 14, wherein the conveying means includes means for sucking the electrolyte through the holes in the item.

38. Arrangement as in claim 14, and further comprising a flow nozzle adapted to inject the electrolyte through holes located in an area of an opening of the flow nozzle, whereby a backflow of the electrolyte through other holes occurs in an edge area of the flow nozzle due to a vacuum that exists on the underside of the item, the flow nozzle being configured to extend across the entire breadth of the item.

39. Arrangement as in claim 38, and further comprising anodes located within the flow nozzle in a pre-chamber surrounded by a housing to which the electrolyte is supplied.

40. Arrangement as in claim 38, and further comprising a suction device arranged on an exit side of the holes to which the electrolyte is conducted with pressure by the flow nozzle, the suction device having a housing which is under an underpressure and extends across the entire breadth of the item.

41. Arrangement as in claim 14, and further comprising lower tubes arranged to convey the electrolyte from the bottom of the item upward, the lower tubes having passage openings for the electrolyte directed toward the bottom of the item.

42. Arrangement as in claim 14, and further comprising spring means for pressing the wiping roller against the surface of the item.

43. Arrangement as in claim 14, wherein the transporting means is operative to transport the items in a horizontal position in the treatment means.

44. Arrangement as in claim 43, wherein the transporting means includes clips which can fasten on at least one side edge of the item.

45. Arrangement as in claim 14, and further comprising two counter rollers arranged on one side of the item, and flooding rollers, the flooding rollers and wiping roller being arranged on an opposite side of the item from the two counter rollers and positioned so that a flow-through space is formed between them for the electrolyte.

* * * * *